United States Patent
Kim et al.

(10) Patent No.: US 8,203,278 B2
(45) Date of Patent: Jun. 19, 2012

(54) POWER SUPPLY FOR LIGHT EMITTING DIODE DISPLAY

(75) Inventors: Jong Duck Kim, Gyunggi-do (KR); Jae Eun Kim, Seoul (KR); Ki Soo Kim, Gyunggi-do (KR)

(73) Assignee: Samsung Electro-Mechanics Co., Ltd., Gyunggi-do (KR)

( * ) Notice: Subject to any disclaimer, the term of this patent is extended or adjusted under 35 U.S.C. 154(b) by 414 days.

(21) Appl. No.: 12/535,387

(22) Filed: Aug. 4, 2009

(65) Prior Publication Data

US 2010/0156307 A1    Jun. 24, 2010

(30) Foreign Application Priority Data

Dec. 22, 2008    (KR) .................. 10-2008-0131313

(51) Int. Cl.
*H05B 37/02* (2006.01)
*G02F 1/133* (2006.01)

(52) U.S. Cl. .................. 315/247; 315/224; 315/291

(58) Field of Classification Search ............ 315/247, 315/224, 291, 307, 308, 209 R, 211
See application file for complete search history.

(56) References Cited

U.S. PATENT DOCUMENTS

2009/0261755 A1 * 10/2009 Choi et al. ............... 315/297

FOREIGN PATENT DOCUMENTS

| KR | 1020030003684 A | 1/2003 |
| KR | 1020050053156 A | 6/2005 |
| KR | 1020060055658 A | 5/2006 |

OTHER PUBLICATIONS

Notice of Office Action for Korean Application No. 10-2008-0131313 mailed Aug. 16, 2010.

* cited by examiner

*Primary Examiner* — Daniel D Chang
(74) *Attorney, Agent, or Firm* — Lowe, Hauptman, Ham & Berner, LLP (57) ABSTRACT

There is provided a power supply for a light emitting diode display using a light emitting diode as a backlight unit that unites a DC power supply provided from outside the light emitting diode display and a driving power supply provided inside the light emitting diode display. A power supply of a light emitting diode display according to an aspect of the invention may include: a power conversion unit converting commercial AC power into at least one driving power having a predetermined voltage level; and a backlight driving unit generating a backlight driving signal using the driving power from the power conversion unit, wherein the power conversion unit and the backlight driving unit are mounted onto one printed circuit board.

12 Claims, 6 Drawing Sheets

POWER SUPPLY FOR LIGHT EMITTING DIODE DISPLAY

CROSS-REFERENCE TO RELATED APPLICATIONS

This application claims the priority of Korean Patent Application No. 2008-0131313 filed on Dec. 22, 2008, in the Korean Intellectual Property Office, the disclosure of which is incorporated herein by reference.

BACKGROUND OF THE INVENTION

1. Field of the Invention

The present invention relates to power supplies for light emitting diode displays, and more particularly, to a power supply for a light emitting diode display using a light emitting diode as a backlight unit that unites a DC power supply provided from outside the light emitting diode display and a driving power supply provided inside the light emitting diode display.

2. Description of the Related Art

Among display devices, light emitting diode displays (LED Displays) have recently been used in various kinds of products, such as desktop computers, laptop computers and AV equipment because they have desirable features, such as small size, light weight and low power consumption.

Backlight units that emit light necessary for pixels have been applied to these light emitting diode displays.

Backlight units include a plurality of bar lamps, power supply circuits supplying power to the plurality of lamps and supplying driving power to another circuit and control units receiving the driving power to control the levels of luminance of the lamps.

As for the above-described lamps, cold cathode fluorescent lamps (CCFLs) are generally used. However, in consideration of process rates, power consumption and life spans, backlight units using light emitting diodes (LEDs) as light sources have appeared.

However, these backlight units having light emitting diodes operate with separate power supplies by additionally using external DC power supplies, such as adapters. The use of the external DC power supplies may cause costs incurred for the provision of power cables, cases and printed circuit boards (PCBs) that form the adapters, reduce the mobility of light emitting diode displays and harm the appearance of light emitting diode displays.

SUMMARY OF THE INVENTION

An aspect of the present invention provides a power supply of a display device that unites a DC power supply provided from outside the display device and a driving power supply provided inside the light emitting diode display.

According to an aspect of the present invention, there is provided a power supply of a light emitting diode display, including: a power conversion unit converting commercial AC power into at least one driving power having a predetermined voltage level; and a backlight driving unit generating a backlight driving signal using the driving power from the power conversion unit, wherein the power conversion unit and the backlight driving unit are mounted onto a single printed circuit board.

The power conversion unit may include: a rectifier rectifying and smoothing commercial AC power; and a converter switching the power rectified and smoothed by the rectifier to convert the switched power into a first driving power used to drive a light emitting diode backlight and a light emitting diode video controller.

The power conversion unit may include a first controller controlling the switching operation of the converter according to a voltage level of the first driving power.

The backlight driving unit may include: a booster converter boosting the voltage level of the first driving power into backlight driving power having a predetermined voltage level; a current controller transmitting the backlight driving power from the booster converter to the light emitting diode backlight and controlling the currents of the backlight driving power; and a second controller controlling the switching operation of the booster converter according to at least one of the current levels of the backlight driving power whose currents are controlled by the current controller or the operating states of the light emitting diode video controller.

The power supply may further include a protection unit mounted onto the one printed circuit board and detecting voltage levels of the backlight driving power to check whether the light emitting diode backlight performs an abnormal operation.

The second controller may control the switching operation of the booster converter according to the detection results of the protection unit.

The power supply may further include a main switch unit mounted onto the one printed circuit board, connected between the power conversion unit and the backlight driving unit and switching the first driving power being transmitted to the backlight driving unit on and off, wherein the second controller controls the on and off switching of the main switch unit according to at least one of the current levels of the backlight driving power, the operating states of the light emitting diode video controller or the detection results of the protection unit.

The first controller may control the switching operation of the converter according to the detection results of the protection unit.

The power conversion unit may include: a rectifier rectifying and smoothing the commercial AC power; and a converter switching the power rectified and smoothed by the rectifier to convert the switched power into a first driving power used to drive a light emitting diode backlight and a second driving power used to drive a light emitting diode video controller.

The power conversion unit may include a first controller controlling the switching operation of the converter according to a voltage level of the second driving power.

The backlight driving unit may include: a booster converter boosting a voltage level of the first driving power into backlight driving power having a predetermined voltage level; a current controller transmitting the backlight driving power from the booster converter to the light emitting diode backlight and controlling the currents of the backlight driving power; and a second controller controlling the switching operation of the booster converter according to at least one of the current levels of the backlight driving power whose currents are controlled by the current controller or the operating states of the light emitting diode video controller.

The power supply may further include a protection unit mounted onto the one printed circuit board and detecting the voltage level of the backlight driving power to check whether the light emitting diode backlight performs an abnormal operation.

The second controller may control the switching operation of the booster converter according to the detection results of the protection unit.

The power supply may further include a main switch unit mounted onto the one printed circuit board, connected between the power conversion unit and the backlight driving unit and switching the first driving power being transmitted to the backlight driving unit on and off, wherein the second controller controls the on and off switching of the main switch unit according to at least one of the current levels of the backlight driving power, the operating states of the light emitting diode video controller and the detection results of the protection unit.

The first controller may control the switching operation of the converter according to the detection results of the protection unit.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

Figure 1:
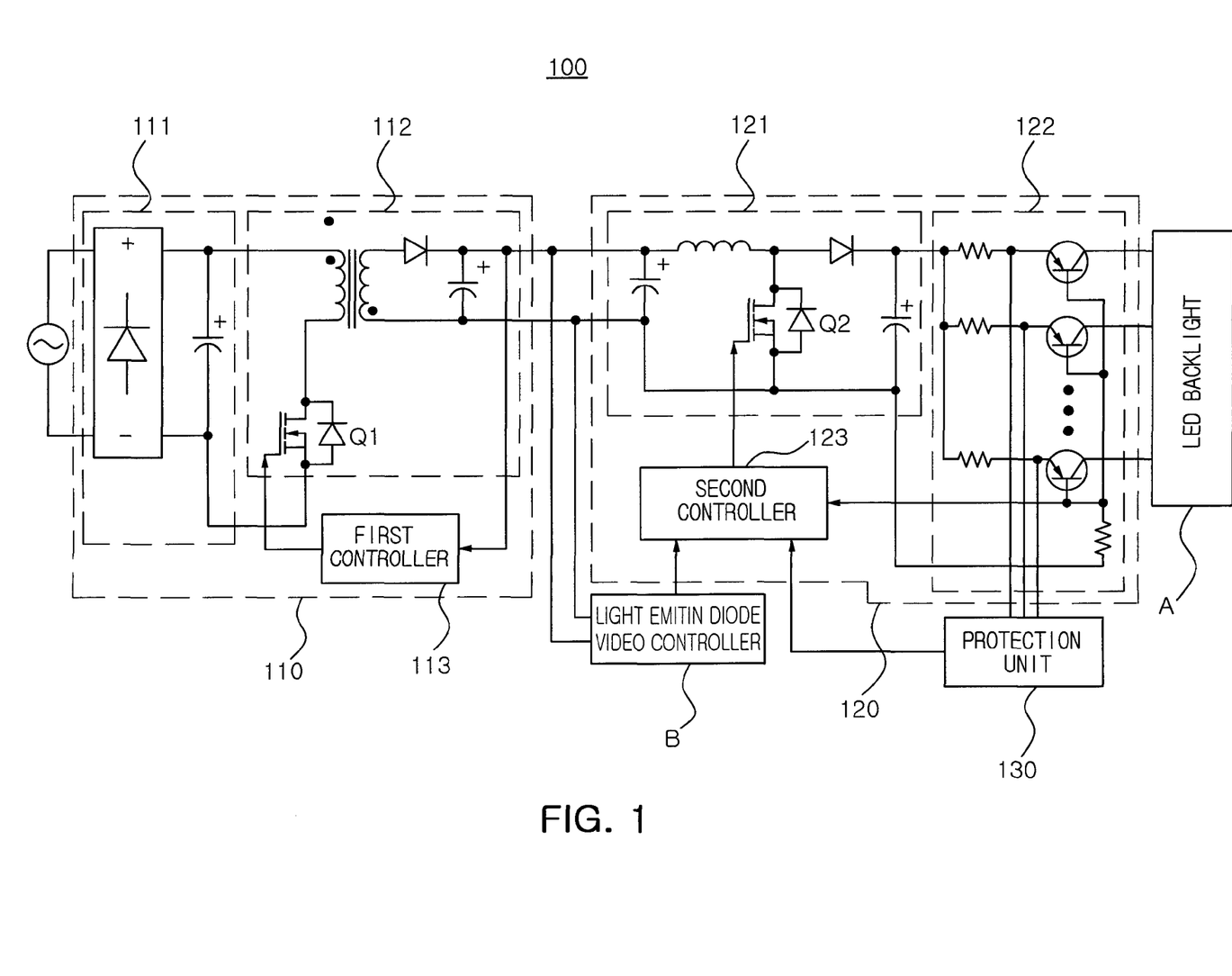
FIG. 1 is a configuration view illustrating a first embodiment of a power supply according to the present invention.

FIG. 1 is a configuration view illustrating a first embodiment of a power supply according to the invention.

Referring to FIG. 1, a first embodiment 100 of a power supply according to the invention may include a power conversion unit 110 and a backlight driving unit 120. The power conversion unit 110 and the backlight driving unit 120 may be mounted onto one printed circuit board.

The power conversion unit 110 may include a rectifier 111, a converter 112 and a first controller 113.

The rectifier 111 may include a bridge diode and a smoothing capacitor to rectify and smooth commercial AC power.

The converter 112 may include a first switch Q1 and a transformer. The first switch Q1 switches the power rectified and smoothed by the rectifier 111. The transformer includes one primary winding and one secondary winding and converts a voltage level of the switched power according to a turns ratio between the primary winding and the secondary winding. A first driving power may be output from the secondary winding of the transformer. The first driving power may be stabilized by a diode and a capacitor connected to the secondary winding, and then output.

The first controller 113 may control the switching operation of the first switch Q1 of the converter 112 according to a voltage level of the first driving power.

The first driving power may be transmitted to the backlight driving unit 120 and the light emitting diode video controller B.

The backlight driving unit 120 receives the first driving power to drive a light emitting diode backlight A. The backlight driving unit 120 may include a booster converter 121, a current controller 122 and a second controller 123.

As shown in FIG. 1, the booster converter 121 may include input and output capacitors, an output diode, an inductor and a second switch Q2. The input and output capacitors stabilize the input power and the output power, respectively. The output diode is coupled to the output capacitor to stabilize the output power. The inductor boosts a voltage level of the first driving power stabilized by the input capacitor, and then, the second switch Q2 switches the first driving power having the boosted voltage level. The first driving power is converted into backlight driving power by the inductor and the second switch Q2, and the backlight driving power is stabilized by the output capacitor and the output diode and is then transmitted to the current controller 122.

The current controller 122 includes a plurality of transistors that individually correspond to the light emitting diode arrays of the light emitting diode backlight. The current controller 122 controls the currents of the backlight driving power, which is then transmitted to each of the light emitting diode arrays of the light emitting diode backlight.

The second controller 123 may control the switching operation of the second switch Q2 of the booster converter 121 according to the current level of the light emitting diode backlight A transmitted to each of the light emitting diode arrays by the current controller 122 or the operating states of the light emitting diode video controller B.

The first embodiment 100 of the power supply according to the invention may further include a protection unit 130.

The protection unit 130 detects the voltage levels of lamp driving power transmitted to the individual transistors of the current controller 122 and checks the states of the light emitting diode arrays of the light emitting diode backlight according to the detected voltage levels. The second controller 123 can control the switching operation of the second switch Q2 of the booster converter 121 according to the detection results of the protection unit 130.

As described above, in the power supply according to the invention, one printed circuit board into which the power conversion function, which has been provided from outside the light emitting diode display in the related art, and the backlight driving function are incorporated is mounted within the light emitting diode display, thereby preventing costs incurred for providing the printed circuit boards, the cases and the power cables that form the power supply according to the related art.

Figure 2:
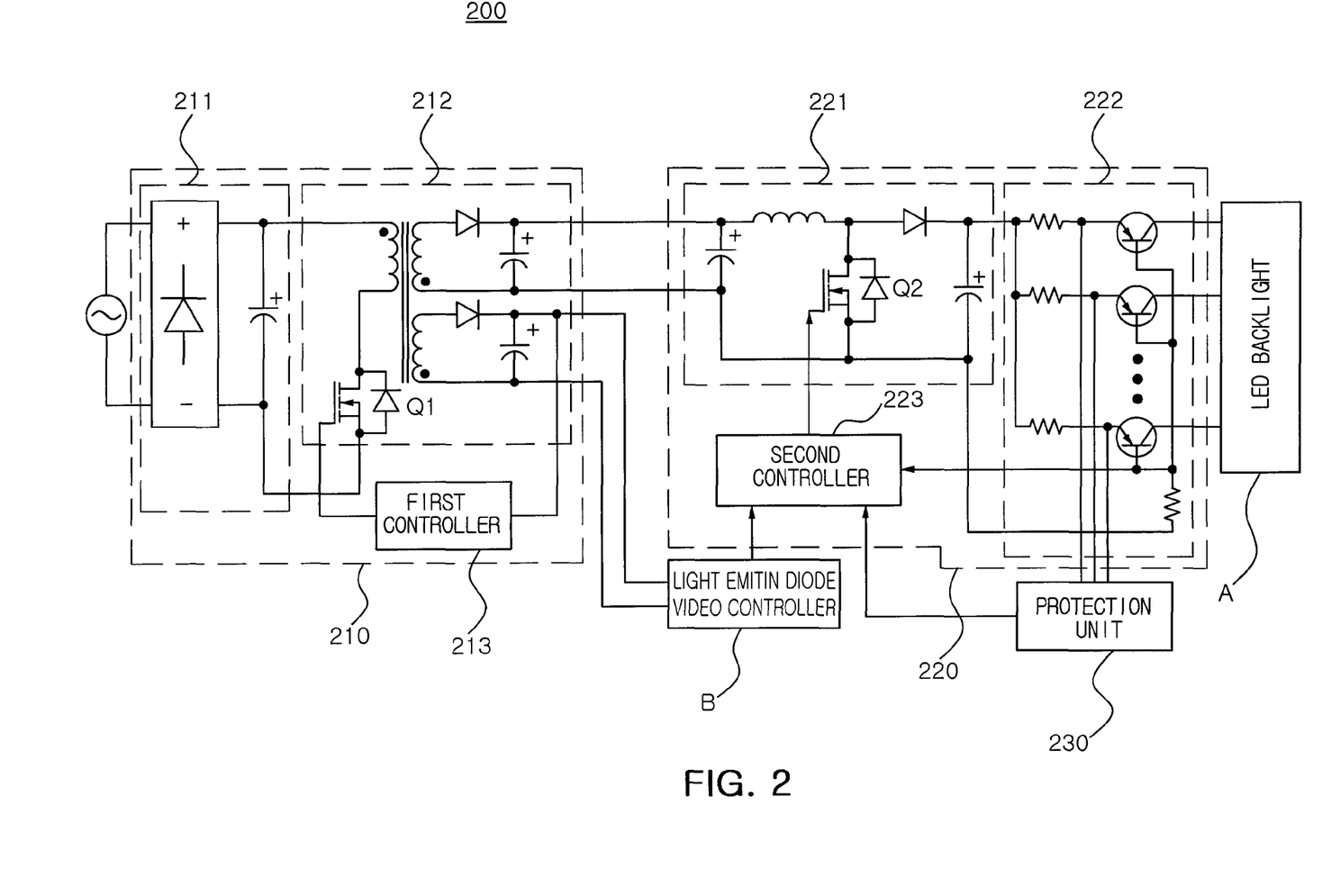
FIG. 2 is a configuration view illustrating a second embodiment of a power supply according to the present invention.

FIG. 2 is a configuration view illustrating a second embodiment of a power supply according to the invention.

Referring to FIGS. 1 and 2, a second embodiment 200 of the power supply according to the invention has a transformer different from that of the converter 112 of the first embodiment 100 of the power supply according to the invention.

That is, a converter 212 of the second embodiment 200 may include a transformer that includes one primary winding and two secondary windings and outputs first and second driving powers according to a turns ratio between the one primary winding and the two secondary windings. The first and second driving powers may be stabilized by diodes and capacitors connected to the corresponding secondary windings, and then output.

The first controller 213 may control the switching operation of a first switch Q1 of the converter 212 according to a voltage level of the second driving power.

The first driving power is transmitted to a backlight driving unit 220 that drives a light emitting diode backlight A, and the second driving power is transmitted to a light emitting diode video controller B.

Since the backlight driving unit 220 and a protection unit 230 of the second embodiment 200 according to the invention have the same configuration and operation as the backlight driving unit 120 and the protection unit 130 of the first embodiment 100 as shown in FIG. 1, a detailed description thereof will be omitted.

Figure 3:
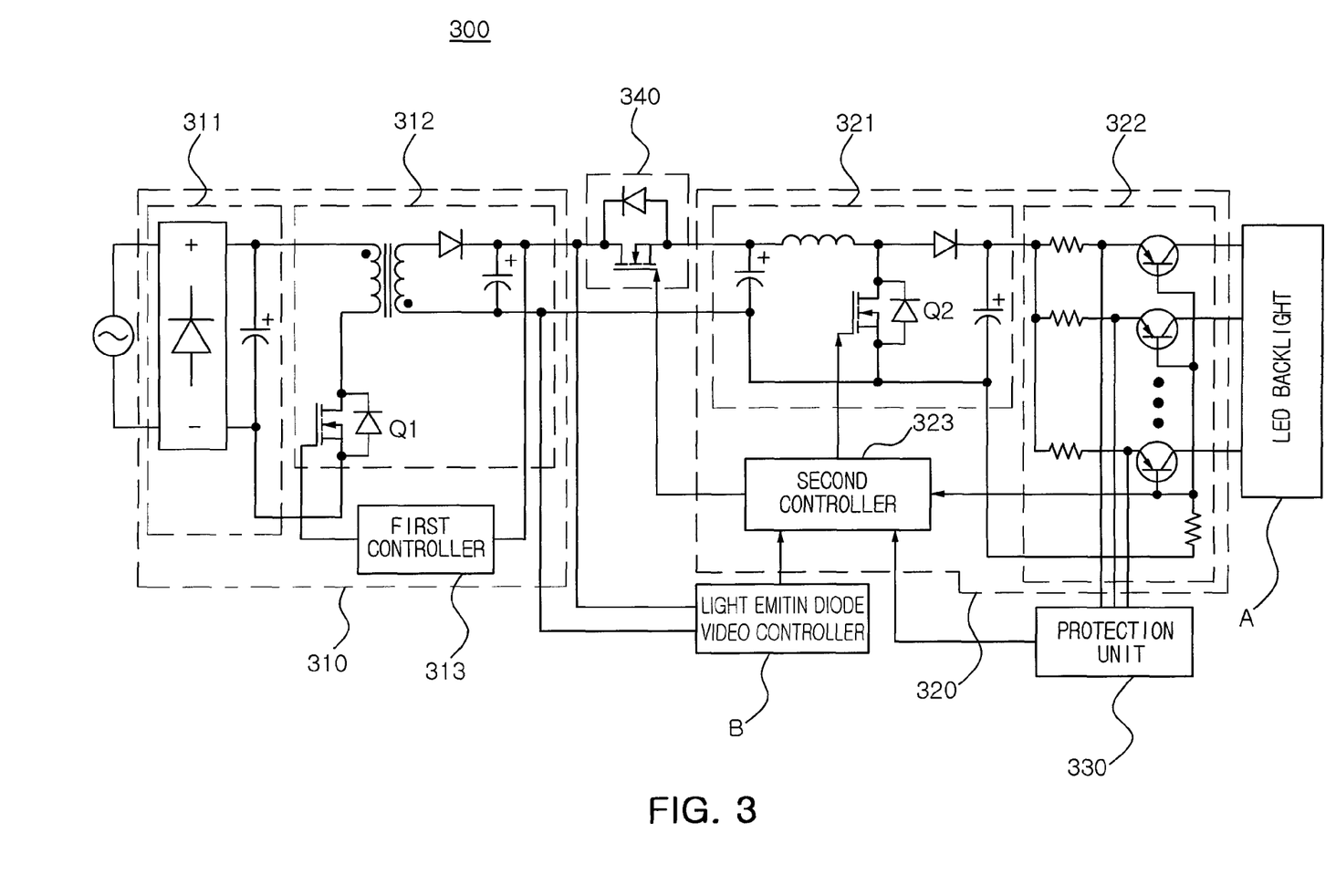
FIG. 3 is a configuration view illustrating a third embodiment of a power supply according to the present invention.

FIG. 3 is a configuration view illustrating a third embodiment of the power supply according to the invention.

Referring to FIGS. 1 and 3, a third embodiment 300 of the power supply according to the invention further includes a main switch unit 340 in comparison with the first embodiment 100 of the power supply according to the invention, shown in FIG. 1.

Therefore, a detailed description of a power conversion unit 310 including a rectifier 311, a converter 312 and a first controller 313; a backlight driving unit 320 including a booster converter 321, a current controller 322 and a second controller 323; and a protection unit 330 of the third embodiment 300 will be omitted.

The main switch unit 340, the power conversion unit 310 and the backlight driving unit 320 are mounted into one printed circuit board. The main switch unit 340 is electrically connected between the power conversion unit 310 and the backlight driving unit 320. That is, a first driving power of the power conversion unit 310 is transmitted to the backlight driving unit 320 through the main switch unit 340. Therefore, the main switch unit 340 can switch on or off the first driving power. The second controller 323 can control the on and off switching of the main switch unit 340.

Specifically, the second controller 323 can control the on and off switching of the main switch unit 340 according to at least one of the current levels of the backlight driving power transmitted to the individual light emitting diode arrays of the light emitting diode backlight A, the operating states of the light emitting diode video controller B or the detection results of the protection unit 330.

The third embodiment 300 of the power supply according to the invention additionally uses the main switch unit 340 that can cut the first driving power being supplied to the backlight driving unit 320 off, thereby reducing unnecessary power consumption in standby mode where the power supply waits before returning to normal operation.

Figure 4:
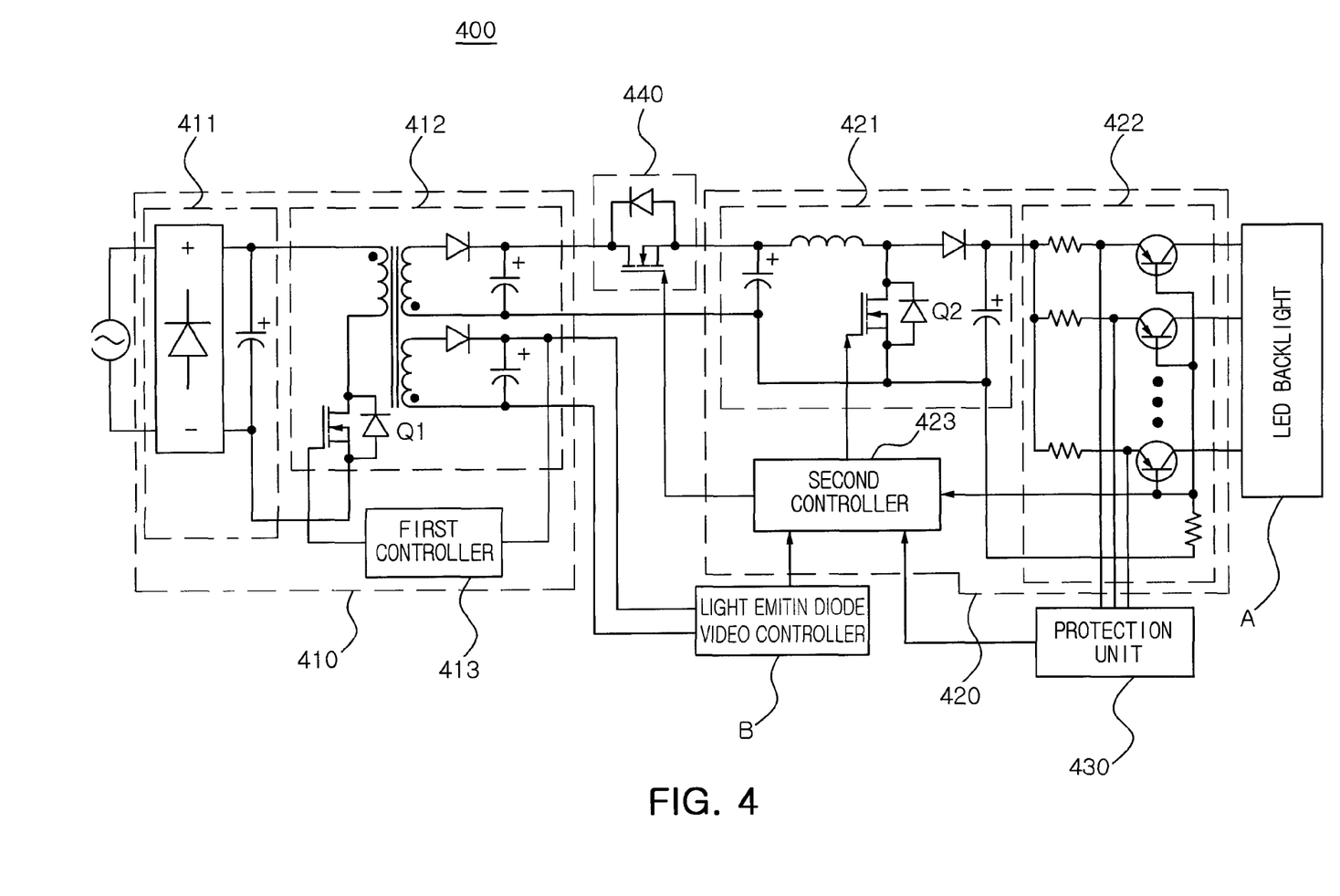
FIG. 4 is a configuration view illustrating a fourth embodiment of a power supply according to the present invention.

FIG. 4 is a configuration view illustrating a fourth embodiment of a power supply according to the invention.

Referring to FIGS. 2 and 4, a forth embodiment 400 of the power supply according to the invention further includes a main switch unit 440 in comparison with the second embodiment 200 of the power supply according to the invention as shown in FIG. 2.

Therefore, a detailed description of a power conversion unit 410 including a rectifier 411, a converter 412 and a first controller 413; a backlight driving unit 420 including a boost controller 421, a current controller 422 and a second controller 423; and a protection unit 430 of the forth embodiment 400 will be omitted.

The main switch unit 440, the power conversion unit 410 and the backlight driving unit 420 are mounted onto the one printed circuit board. The main switch unit 440 is electrically connected between the power conversion unit 410 and the backlight driving unit 420, and switches on or off the first driving power being transmitted to the backlight driving unit 220 from the power conversion unit 410 through the main switch unit 440. The on and off switching of the main switch unit 440 can be controlled by the second controller 423.

The second controller 423 can control the on and off switching of the main switch unit 440 according to at least one of the current levels of the backlight driving power transmitted to the individual light emitting diode arrays of the light emitting diode backlight A, the operating states of the light emitting diode video controller B or the detection results of the protection unit 430.

Therefore, the forth embodiment 400 of the power supply according to the invention additionally uses the main switch unit 440 that can cut off the first driving power being supplied to the backlight driving unit 420, thereby reducing unnecessary power consumption in standby mode where the power supply waits before returning to normal operation.

As described above, in the power supply according to the invention, one printed circuit board into which the power conversion function, which has been provided from outside the light emitting diode display in the related art, and the backlight driving function are incorporated is mounted within the light emitting diode display, thereby preventing costs being incurred for the printed circuit boards, the cases and the power cables that form the power supply according to the related art, and, at the same time, reducing unnecessary power consumption by cutting off the driving power according to the operating states of the backlight or the operating states of the light emitting diode video controller.

Figure 5:
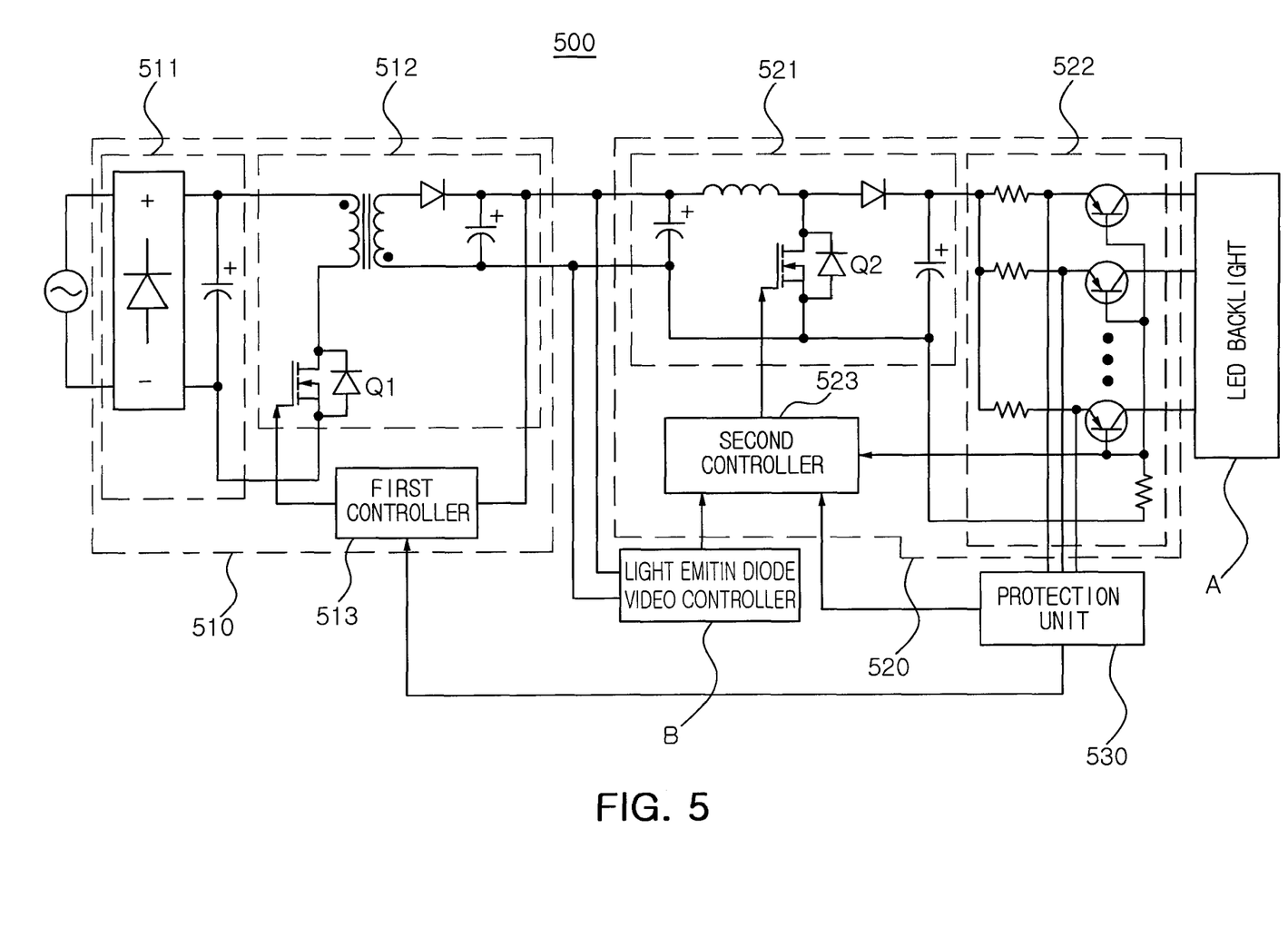
FIG. 5 is a configuration view illustrating a fifth embodiment of a power supply according to the present invention.

FIG. 5 is a configuration view illustrating a fifth embodiment of a power supply according to the invention.

Referring to FIGS. 1 and 5, a fifth embodiment 500 of the power supply according to the invention further includes a first controller 513 in comparison with the first embodiment 100 of the power supply according to the invention as shown in FIG. 1.

Therefore, a detailed description of a power conversion unit 510 including a rectifier 511, a converter 512 and a first controller 513; a backlight driving unit 520 including a booster converter 521, a current controller 522 and a second controller 523; and a protection unit 530 of the fifth embodiment 500 will be omitted.

The first controller 513 can control the switching operation of the converter 512 according to the detection results of the protection unit 530.

When failures occur in the light emitting diode arrays of the light emitting diode backlight A, the first controller 513 may control the switching operation of the converter 512 to cut off the first driving power being transmitted to the backlight driving unit 520.

Figure 6:
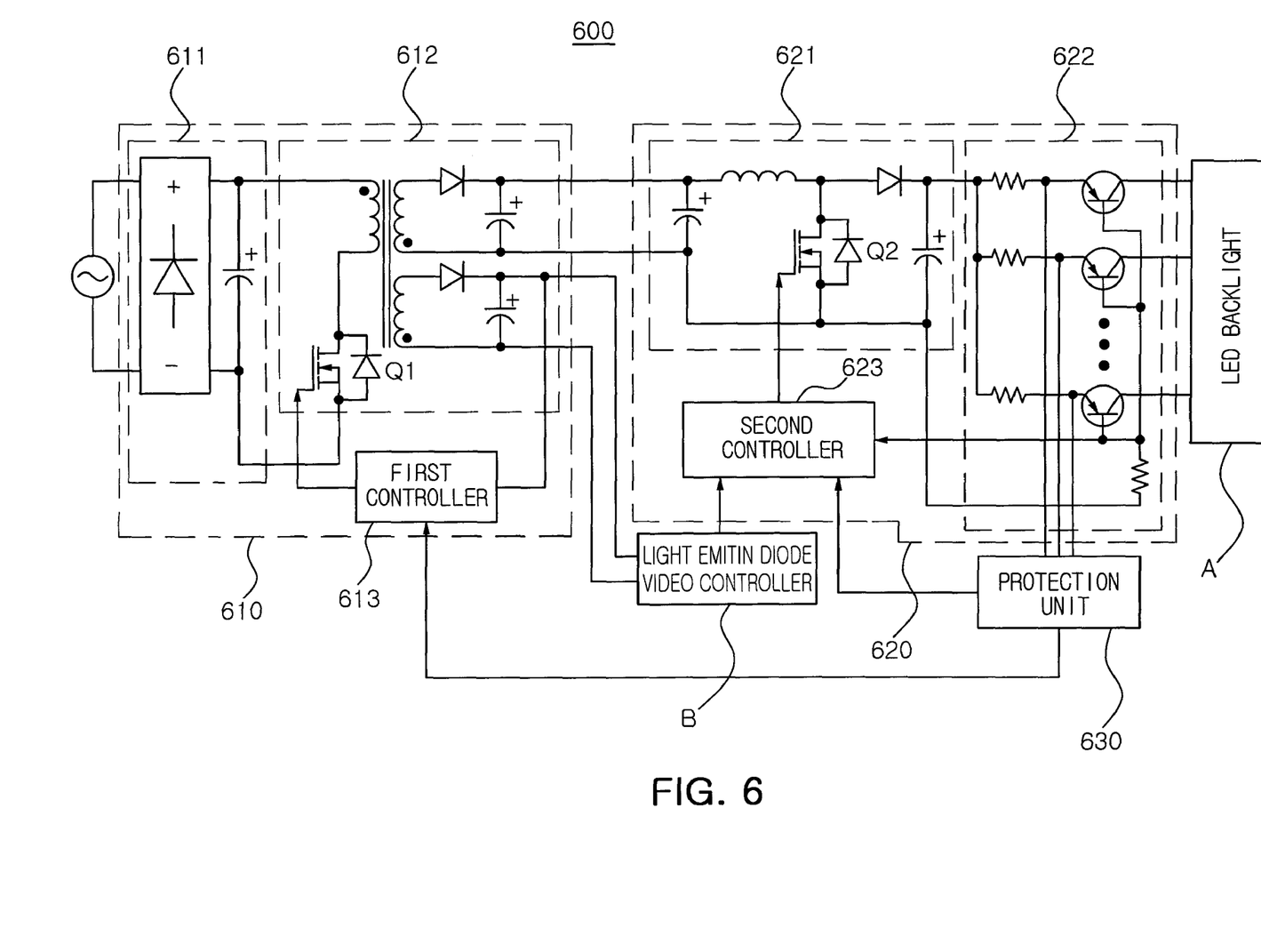
FIG. 6 is a configuration view illustrating a sixth embodiment of a power supply according to the present invention.

FIG. 6 is a configuration view illustrating a sixth embodiment of a power supply according to the invention.

Referring to FIGS. 2 and 6, a sixth embodiment 600 of the power supply according to the invention further includes a first controller 613 in comparison with the second embodiment 200 of the power supply according to the invention as shown in FIG. 2.

Therefore, a detailed description of a power conversion unit 610 including a rectifier 611, a converter 612 and a first controller 613; a backlight driving unit 620 including a booster converter 621, a current controller 622 and a second controller 623; and a protection unit 630 of the sixth embodiment 600 will be omitted.

The first controller 613 may control the switching operation of the converter 612 according to the detection results of the protection unit 330.

Therefore, when failures occur in the light emitting diode arrays of the light emitting diode backlight A, the first controller 613 may cut off the first driving power being transmitted to the backlight driving unit 620 by controlling the switching operation of the converter 612.

As described above, in the power supply according to the invention, one printed circuit board into which the power conversion function, which has been provided from outside the light emitting diode display in the related art, and the backlight driving function are incorporated is mounted within the light emitting diode display, thereby preventing costs incurred for providing the printed circuit boards, the cases and the power cables that form the power supply according to the related art.

As set forth above, according to exemplary embodiments of the invention, a power supply for a light emitting diode display units a DC power supply provided from outside the light emitting diode display and a driving power supply inside the light emitting diode display, thereby preventing costs being incurred for the provision of printed circuit boards, cases and power cables, increasing the mobility of the light emitting diode display and improving the appearance thereof.

While the present invention has been shown and described in connection with the exemplary embodiments, it will be apparent to those skilled in the art that modifications and variations can be made without departing from the spirit and scope of the invention as defined by the appended claims.

What is claimed is:

1. A power supply for a light emitting diode display, the power supply comprising:
    a power conversion unit configured to convert commercial AC power into at least one driving power having a predetermined voltage level; and
    a backlight driving unit configured to generate a backlight driving signal using the driving power from the power conversion unit,
    wherein
    the power conversion unit and the backlight driving unit are mounted onto one printed circuit board,
    the power conversion unit comprises:
        a rectifier configured to rectify and smooth the commercial AC power;
        a converter configured to switch the power rectified and smoothed by the rectifier to convert the switched power into a first driving power for driving a light emitting diode backlight and a light emitting diode video controller; and
        a first controller configured to control a switching operation of the converter according to a voltage level of the first driving power.

2. The power supply of claim 1, wherein the backlight driving unit comprises:
    a booster converter configured to boost the voltage level of the first driving power into backlight driving power having a predetermined voltage level;
    a current controller configured to transmit the backlight driving power from the booster converter to the light emitting diode backlight and control a current of the backlight driving power; and
    a second controller configured to control a switching operation of the booster converter according to at least one of a current level of the backlight driving power controlled by the current controller or an operating state of the light emitting diode video controller.

3. The power supply of claim 2, further comprising a protection unit mounted onto the one printed circuit board, the protection unit being configured to detect the voltage level of the backlight driving power to check whether the light emitting diode backlight performs an abnormal operation.

4. The power supply of claim 3, wherein the second controller is configured to control the switching operation of the booster converter according to a detection result of the protection unit.

5. The power supply of claim 3, further comprising a main switch unit mounted onto the one printed circuit board and connected between the power conversion unit and the backlight driving unit, the main switch unit being configured to switch the first driving power being transmitted to the backlight driving unit on and off, wherein
    the second controller is configured to control an on and off switching of the main switch unit according to at least one of the current level of the backlight driving power, the operating state of the light emitting diode video controller, or a detection result of the protection unit.

6. The power supply of claim 3, wherein the first controller is configured to control the switching operation of the converter according to a detection result of the protection unit.

7. A power supply for a light emitting diode display, the power supply comprising:
    a power conversion unit configured to convert commercial AC power into at least one driving power having a predetermined voltage level; and
    a backlight driving unit configured to generate a backlight driving signal using the driving power from the power conversion unit,
    wherein
    the power conversion unit and the backlight driving unit are mounted onto one printed circuit board,
    the power conversion unit comprises:
        a rectifier configured to rectify and smooth the commercial AC power;
        a converter configured to switch the power rectified and smoothed by the rectifier to convert the switched power into a first driving power for driving a light emitting diode backlight and a second driving power for driving a light emitting diode video controller; and
        a first controller configured to control a switching operation of the converter according to a voltage level of the second driving power.

8. The power supply of claim 7, wherein the backlight driving unit comprises:
    a booster converter configured to boost a voltage level of the first driving power into backlight driving power having a predetermined voltage level;
    a current controller configured to transmit the backlight driving power from the booster converter to the light emitting diode backlight and control a current of the backlight driving power; and
    a second controller configured to control a switching operation of the booster converter according to at least one of a current level of the backlight driving power controlled by the current controller or an operating state of the light emitting diode video controller.

9. The power supply of claim 8, further comprising a protection unit mounted onto the one printed circuit board, the protection unit being configured to detect the voltage level of the backlight driving power to check whether the light emitting diode backlight performs an abnormal operation.

10. The power supply of claim 9, wherein the second controller is configured to control the switching operation of the booster converter according to a detection result of the protection unit.

11. The power supply of claim 9, further comprising a main switch unit mounted onto the one printed circuit board and connected between the power conversion unit and the backlight driving unit, the main switch unit being configured to switch the first driving power being transmitted to the backlight driving unit on and off, wherein the second controller is configured to control an on and off switching of the main switch unit according to at least one of the current level of the backlight driving power, the operating state of the light emitting diode video controller, or a detection result of the protection unit.

12. The power supply of claim 9, wherein the first controller is configured to control the switching operation of the converter according to a detection result of the protection unit.

* * * * *